(12) United States Patent
Jang et al.

(10) Patent No.: US 7,589,598 B2
(45) Date of Patent: Sep. 15, 2009

(54) DUAL-BAND VOLTAGE CONTROLLED OSCILLATOR

(75) Inventors: Sheng Lyang Jang, Taipei (TW); Shao Hua Li, Taipei (TW)

(73) Assignee: National Taiwan University of Science & Technology, Taipei (TW)

( * ) Notice: Subject to any disclaimer, the term of this patent is extended or adjusted under 35 U.S.C. 154(b) by 0 days.

(21) Appl. No.: 11/605,969

(22) Filed: Nov. 30, 2006

(65) Prior Publication Data

US 2008/0129403 A1     Jun. 5, 2008

(51) Int. Cl.
*H03B 5/12* (2006.01)
(52) U.S. Cl. .................... 331/49; 331/48; 331/117 R; 331/117 FE; 331/177 V; 331/179
(58) Field of Classification Search ............... 331/36 C, 331/46, 48, 49, 56, 96, 117 R, 117 FE, 117 D, 331/177 R, 177 V, 179, 185, 186
See application file for complete search history.

(56) References Cited

U.S. PATENT DOCUMENTS 5,629,652 A * 5/1997 Weiss ..................... 331/108 B

* cited by examiner

*Primary Examiner*—David Mis
(74) *Attorney, Agent, or Firm*—Birch, Stewart, Kolasch & Birch, LLP

(57) ABSTRACT

The present invention discloses a dual-band voltage controlled oscillator (VCO), comprising a plurality of resonant circuits; an inductor module; a plurality of switches of current source; a buffer circuit; and a output port. The dual-band voltage controlled oscillator (VCO) according to the invention uses the current source in such two VCOs with different resonant frequencies as the switch device to combine the two VCOs and uses the common inductor module for the two VCOs to save the chip size.

7 Claims, 7 Drawing Sheets

| Specification | results |
|---|---|
| Supply voltage | 1.8V |
| Center frequency of VCO | 5.2GHz & 2.4GHz |
| Tunable voltage range of VCO | 0V~1.8V |
| Tunable frequency range of VCO | 4.84G~5.75G<br>2.32G~2.61G |
| Power consumption of VCO ($v_{dd}$ = 1.8V) | 5.2GHz = 10.69mW<br>2.4GHz = 6.93mW |
| Phase noise of VCO [dBc/Hz] | 5.2GHz@1M = -120.7<br>2.4GHz@1M = -124.1 |
| Buffer current of VCO | 8.4 mA |
| Output power of VCO | 5.2GHz = -1dBm<br>2.4GHz = 3.97dBm |

Table 1

DUAL-BAND VOLTAGE CONTROLLED OSCILLATOR

BACKGROUND OF THE INVENTION

1. Field of the Invention

The present invention generally relates to a voltage controlled oscillator (VCO), and more particularly to a dual band voltage controlled oscillator using a technology of switching current source.

2. Description of the Related Art

The rapid development of the coexist operation of multi-standard wireless and mobile communication has been driving conventional RF and baseband transceivers to have integrated multi-band and multi-functional characteristics, such as the multimode wireless LAN IEEE802.11a/b/g card, the integrated Blue-Tooth and wireless LAN card, and the integrated GSM/WLAN handset. This requirement has driven the conventional single-band RF circuits, such as low-noise amplifier (LNA), bandpass filter, mixers, voltage controlled oscillators (VCOs) and power amplifier (PA), to a new design era. To provide the multibands, such as 900/1800 MHz GSM mobile communication and 2.4/5.2 GHz wireless local area network, a single circuit with at least two bands becomes an important research topic. Numbers of work have been demonstrated the different approaches on the dual-band transceiver, which can effectively reduce the power consumption.

In various radio frequency (RF) active devices, the voltage controlled oscillator is an important key component. The basic theory and different design methods of voltage controlled oscillator can be found in the book "CMOS" pressed by IEEE Press. Since the voltage controlled oscillator determine the quality and reliability of information, the design of high performance voltage controlled oscillator in single chip of communication system is an important topic.

Two types of voltage controlled oscillator are adopted for CMOS RFIC: LC tank VCO and ring VCO. Such two types of VCO have their own advantages and disadvantages. The advantages of ring VCO are small chip size and large output signal due to easy integration with phase locked loop (PLL) circuit, while the disadvantages of ring VCO are poor phase noise due to more active devices using in the circuit. The advantages of LC tank VCO are better phase noise and simpler circuit topology than the ring VCO, while its disadvantages are large chip size and unstable process. Prior art can be found in U.S. Pat. No. 6,194,975 issued to Su al., entitled "Dual band VCO with improved phase noise". It discloses the method of improved phase noise for the dual band VCO. However, too many devices are used in this disclosure, causing a complex circuit and large power consumption.

To overcome the aforementioned problems, there is needed to provide a novel dual band VCO. Thus, in the present invention, a novel dual-band VCO using a technology of switching current source is proposed.

SUMMARY OF THE INVENTION

It is an objective of the present invention to provide a dual-band VCO, capable of using in the concurrent dual-band wireless local area network.

It is another objective of the present invention to provide a dual-band VCO, using the current source of such two VCOs with different resonant frequencies as the switch device to combine the two VCOs and using the common inductor module for the two VCOs to save the chip size.

To achieve the above objectives, the present invention provides a dual-band VCO, comprising a plurality of resonant circuits; an inductor module, electrically connected to the plurality of resonant circuits; a plurality of switches of current source, electrically connected to the plurality of resonant circuits; a buffer circuit, electrically connected to the inductor module and plurality of resonant circuits, and a output port, electrically connected to the buffer circuit. The plurality of resonant circuits is used to determine a output frequency of the dual band VCO. The inductor module is used to control the inductance of the plurality of resonant circuits to tune the frequency range of the output frequency of the dual band VCO. The plurality of switches of current source is used to switch the output frequency of the dual band VCO. The buffer circuit is used to isolate the interference of next stage circuit and the output port is used to output the output signal.

According to one aspect of the dual-band VCO, the inductor module comprises a plurality of inductor, combined with types of series or shunt, used to provide the required inductance of the plurality of resonant circuits, to tune the frequency range of the output frequency of the dual band VCO.

According to another aspect of the dual-band VCO, the plurality of resonant circuits are selected from one of the circuit groups, including a type of back gate coupled difference and a type of dual back gate coupled difference.

According to another aspect of the dual-band VCO, wherein the inductor module is constructed in series from two spiral inductors fabricated by 0.18 μm technology.

BRIEF DESCRIPTION OF THE DRAWINGS

All the objects, advantages, and novel features of the invention will become more apparent from the following detailed descriptions when taken in conjunction with the accompanying drawings.

DETAILED DESCRIPTION OF THE PREFERRED EMBODIMENT

Although the invention has been explained in relation to several preferred embodiments, the accompanying drawings and the following detailed descriptions are the preferred embodiment of the present invention. It is to be understood that the following disclosed descriptions will be examples of present invention, and will not limit the present invention into the drawings and the special embodiment.

In general, the oscillator is formed from three parts, comprising (1) the resonant tank, having the functions of storing energy and determining the frequency; (2) the active devices, generating a negative resistance to achieve the starting condition of resonance through a suitable feedback; and (3) the output coupled network, coupling the oscillating energy to the load. The disclosed differential output VCO of the present invention adopts differential output of LC resonance.

Figure 1:
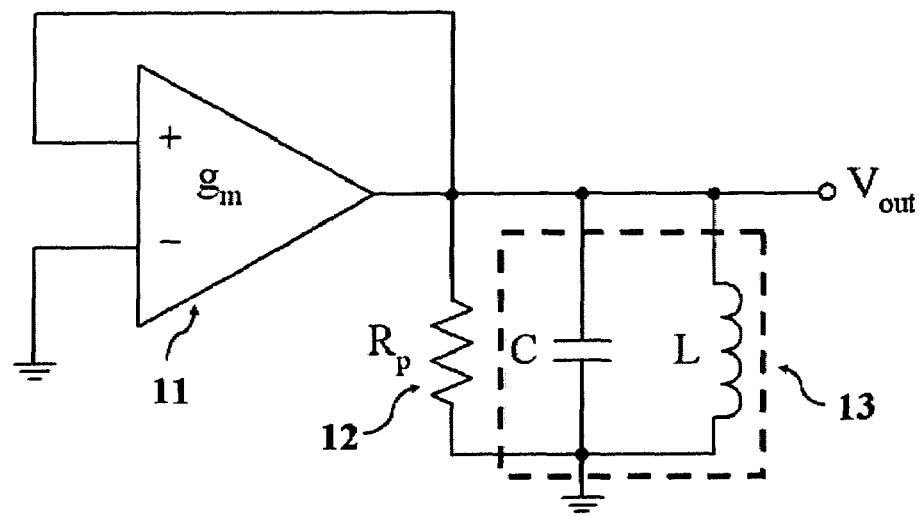
FIG. 1 shows a schematic of a basic LC tank VCO.

Referring to the FIG. 1, it is a schematic of a basic LC tank VCO. The LC resonant oscillator 10 use the active amplifying device 11 to compensate the power loss of the parasitic resistance 12, where $g_m$ is the trans-conductance; $R_p$ is the parasitic resistance 12 of the LC resonant tank. The resonant frequency and the trans-conductance can be found as follows:

$$f_0 = \frac{1}{2\pi\sqrt{LC}} \quad (1)$$

$$g_m = \frac{1}{R_p} \quad (2)$$

Figure 2:
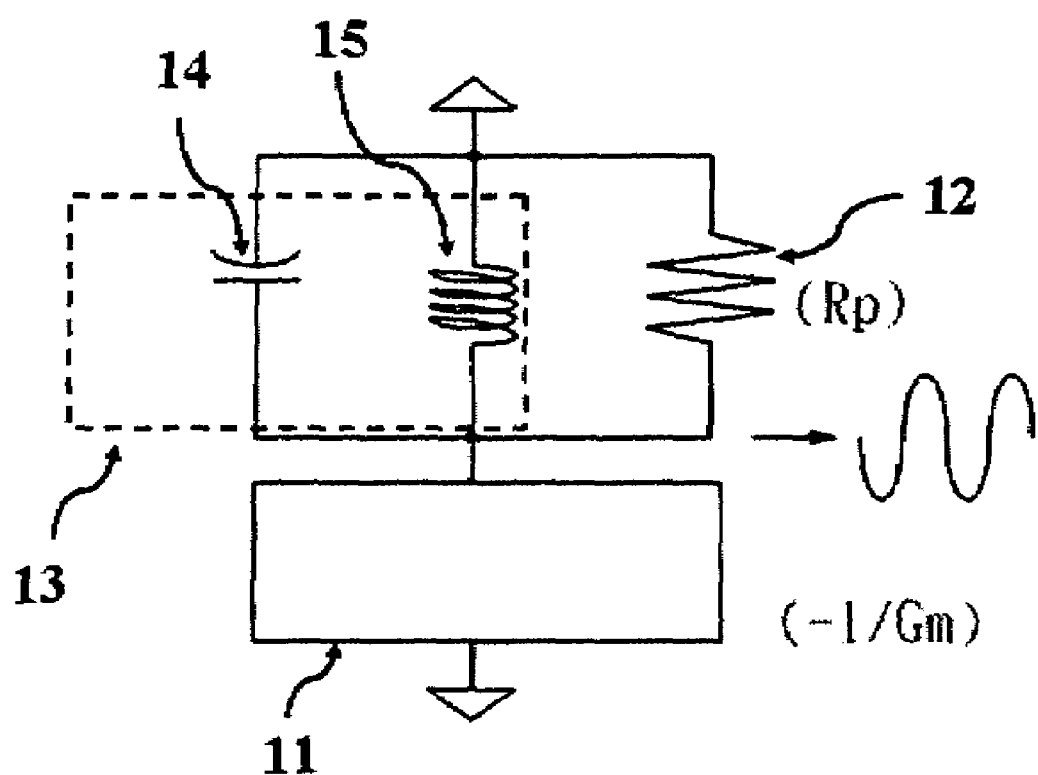
FIG. 2 indicates the resonant tank of oscillator.

FIG. 2 indicates the resonant tank of oscillator. The parasitic resistance 12 ($R_p$) of the LC resonant tank would cause the energy loss in the electromagnetic transform of the inductance and capacitance. Thus, the active devices, such as P type metal-oxide-semiconductor field effect transistor (PMOS FET) or N type metal-oxide-semiconductor field effect transistor (NMOS FET) generating a negative resistance ($-1/G_m$) to achieve the starting condition of resonance through a suitable feedback can compensate the parasitic resistance 12. Thus, if the condition of $Gm*R_p=1$ is satisfied, the energy loss in the electromagnetic transform of the inductance and capacitance in the LC resonant tank would not happen and the oscillating signal in the oscillator would be continuous and stable.

According to the aforementioned concept, the disclosed dual band VCO using a technology of switching current source has two VCOs with LC tank type with two different desired frequencies switched by a current source. By switching the current source to turn on the dual band VCO, the disclosed dual band VCO can select the desired frequency. In addition, the common inductor module can combine the inductors of the two VCOs together to reduce the chip size.

Figure 3:
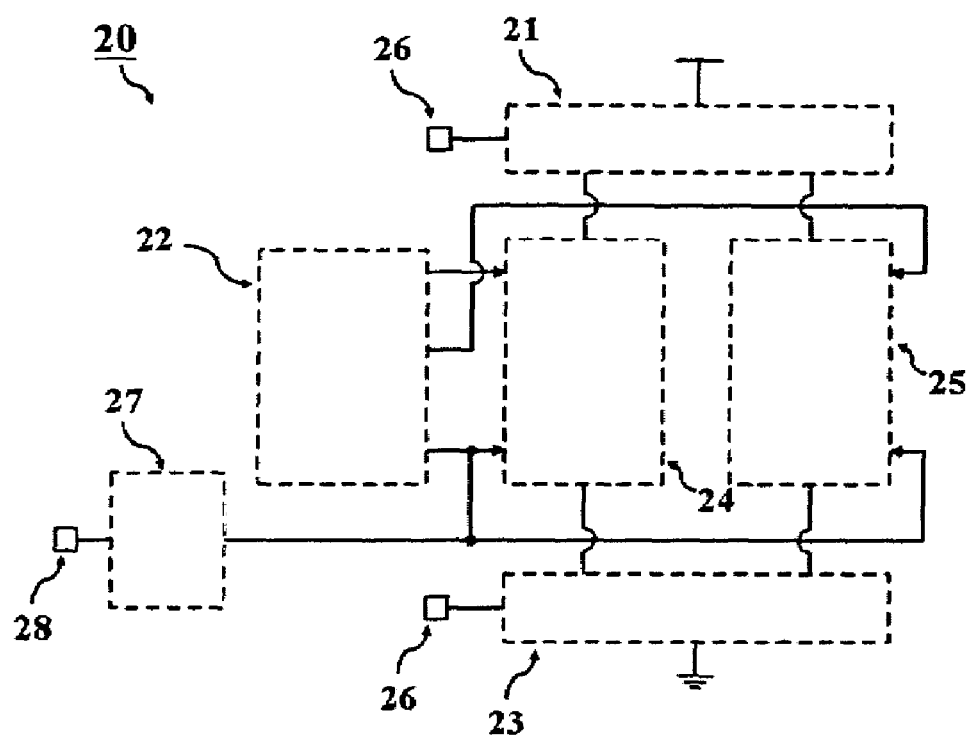
FIG. 3 shows a structural block of the dual-band VCO according to the present invention.

Referring to the FIG. 3, it shows a structural block of the dual-band VCO according to the present invention. The dual-band VCO 20 comprises a plurality of resonant circuits (24)(25); an inductor module 22; a plurality of switches of current source (21)(22); a buffer circuit 27 and a output port 28. The plurality of resonant circuits (24)(25) are used to determine a output frequency of the dual band VCO 20. The inductor module 22 is electrically connected to the plurality of resonant circuits (24)(25) and is used to control the inductance of the plurality of resonant circuits (24)(25), to tune the frequency range of the output frequency of the dual band VCO 20. The inductor module 22 is constructed in series from two spiral inductors fabricated by 0.18 μm technology. The plurality of switches of current source (21)(23) are electrically connected to the plurality of resonant circuits (24)(25) and are used to switch the output frequency of the dual band VCO 20. The buffer circuit 27 is electrically connected to the inductor module 22 and plurality of resonant circuits (24)(25) and is used to isolate the interference of next stage circuit. The output port 28 is electrically connected to the buffer circuit 27 and is used to output the output signal.

The plurality of resonant circuits (24)(25) comprises a first resonant circuit 24 and a second resonant circuit 25. The first resonant circuit 24 has a first plurality of metal-oxide-semiconductor field effect transistor (MOSFET) (240)(241), a first variable capacitor 242 and a first tunable bias 243. The first tunable bias 243 is used to tune a first output frequency (2.4 GHz) of the dual band VCO 20. The second resonant circuit 25 is electrically connected to the first resonant circuit 24 and has a second plurality of metal-oxide-semiconductor field effect transistor (MOSFET)(250)(251), a second variable capacitor 252 and a second tunable bias 253. The second tunable bias 253 is used to tune a second output frequency (5.2 GHz) of the dual band VCO 20.

The plurality of switches of current source (21)(23) comprises a current source constructed from a PMOS FET 21 and a current source constructed from a NMOS FET 23. The current source constructed from a PMOS FET 21 is electrically connected to the first resonant circuit 24 and the second resonant circuit 25, and has a third plurality of metal-oxide-semiconductor field effect transistor (MOSFET) (210)(211), a first inverter 212 and a bias of switching frequency 26.

The current source constructed from a NMOS FET 23 is electrically connected to the first resonant circuit 24 and the second resonant circuit 25, and has a fourth plurality of metal-oxide-semiconductor field effect transistor (MOSFET) (230) (231), a second inverter 232 and the bias of switching frequency 26. The bias of switching frequency 26 outputs a signal of 0 or 1.

The transistor of present invention can be implemented by using Bipolar Junction Transistor (BJT), Heterojunction Bipolar Transistor (HBT), High Electronic Mobility Transistor (HEMT), Pseudomorphic HEMT (PHEMT), Complementary Metal Oxide Semiconductor Filed Effect Transistor (CMOS) and Laterally Diffused Metal Oxide Semiconductor Filed Effect Transistor (LDMOS). Preferably, PHEMT is suitable for the gain stage and power stage in the microwave to millimeter wave range. Semiconductor materials broadly applicable to the gain stage and power stage include: silicon, silicon-on-insulator (SOI), silicon-germanium (SiGe), gallium arsenide (GaAs), indium phosphide (InP) and silicon-germanium-carbon (SiGe—C) materials.

Figure 4:
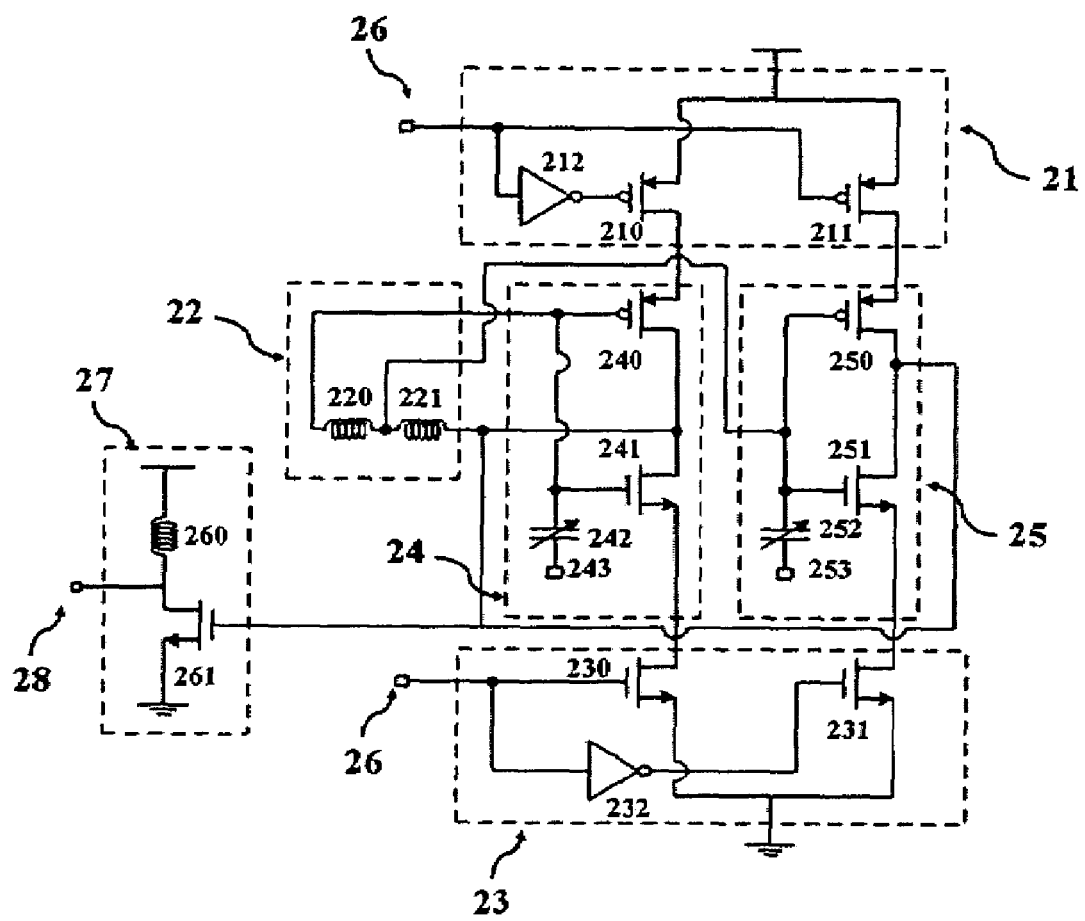
FIG. 4 shows the circuit of the dual-band VCO according to the first embodiment of the present invention.

Referring to the FIG. 3 and FIG. 4, FIG. 3 shows a structural block of the dual-band VCO according to the present invention and FIG. 4 shows the circuit of the dual-band VCO according to the first embodiment of the present invention. As voltage level of the bias of switching frequency 26 of the dual band VCO 20 is high, the transistor 210 of current source constructed from a PMOS FET 21 and the transistor 230 of the current source constructed from a NMOS FET 23 will be turned on. Thus, the first plurality of metal-oxide-semiconductor field effect transistor (MOSFET) (240)(241) of the first resonant circuit 24 can generate enough negative resistance ($-1/G_m$) to compensate the parasitic dissipated resistance Rp of resonant tank and then to achieve the starting condition of resonance. The inductance 260 and the first variable capacitor 242 of the first resonant circuit 24 determine the output signal of 2.4 GHz. Similarly, as voltage level of the bias of switching frequency 26 of the dual band VCO 20 is low, the transistor 211 of current source constructed from a PMOS FET 21 and the transistor 231 of current source constructed from a NMOS FET 23 will be turned on. Thus, the first plurality of metal-oxide-semiconductor field effect transistor (MOSFET) (250)(251) of the first resonant circuit 24 can generate enough negative resistance ($-1/G_m$) to compensate the parasitic dissipated resistance Rp of resonant tank and then to achieve the starting condition of resonance. The inductance 260 and the first variable capacitor 252 of the first resonant circuit 25 determine the output signal of 5.2 GHz.

Figure 5:
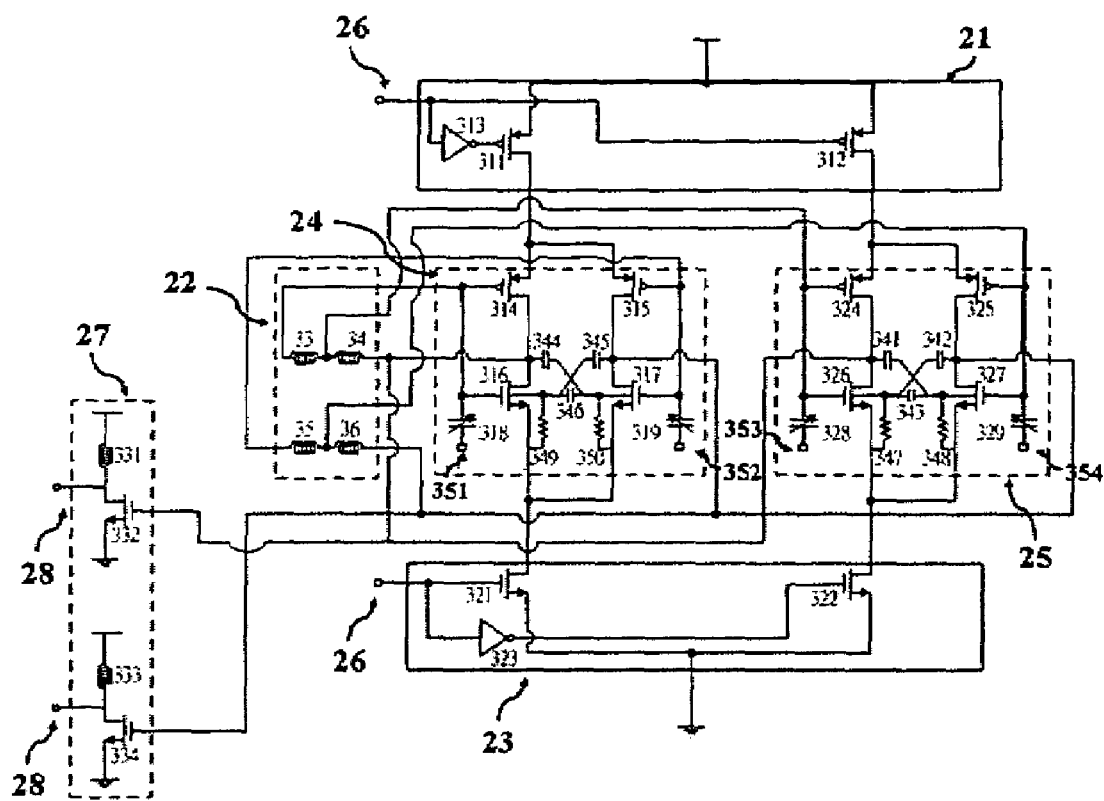
FIG. 5 shows the circuit of the dual-band VCO according to the second embodiment of the present invention.

Referring to FIG. 5, it shows the circuit of the dual-band VCO according to the second embodiment of the present invention. The disclosed VCO use the type of back gate coupled difference. The inductor module 22 has two inductance sets, having the inductors (33)(34) in series and inductors (35)(36) in series, respectively.

The first resonant circuit 24 is constructed from PMOSFET (314)(315), NMOSFET (316)(317), variable capacitors (318) (319). Through the capacitors (344)(345)(346), the back gate of the NMOSFET can be coupled to achieve the difference output. The voltage divider constructed from the capacitors (344)(345)(346) can reduce the phase noise of the dual band VCO 20 and the resistors (349)(350) can provide the DC bias to back gate of the transistor. The second resonant circuit 25 is constructed from PMOSFET (324)(325), NMOSFET (326)(327), variable capacitors (328)(329). Through the capacitors (341)(342)(343), the back gate of the NMOSFET can be coupled to achieve the difference output. The voltage divider constructed from the capacitors (341)(342)(343) can reduce the phase noise of the dual band VCO 20 and the resistors (347)(348) can provide the DC bias to back gate of the transistor.

As voltage level of the bias of switching frequency 26 of the dual band VCO 20 is high, the transistor 311 of current source constructed from a PMOS FET 21 and the transistor 321 of the current source constructed from a NMOS FET 23 will be turned on. Thus, the first plurality of metal-oxide-semiconductor field effect transistor (MOSFET) of the first resonant circuit 24 can generate enough negative resistance ($-1/G_m$) to compensate the parasitic dissipated resistance Rp of resonant tank and then to achieve the starting condition of resonance. The inductors (33)(34) in series and the inductors (35)(36) in series of the inductor module 22 and the variable capacitor 318 of the first resonant circuit 24 determine the output signal of 2.4 GHz. Similarly, as voltage level of the bias of switching frequency 26 of the dual band VCO 20 is low, the dual band VCO will output a signal of 5.2 GHz.

Figure 6:
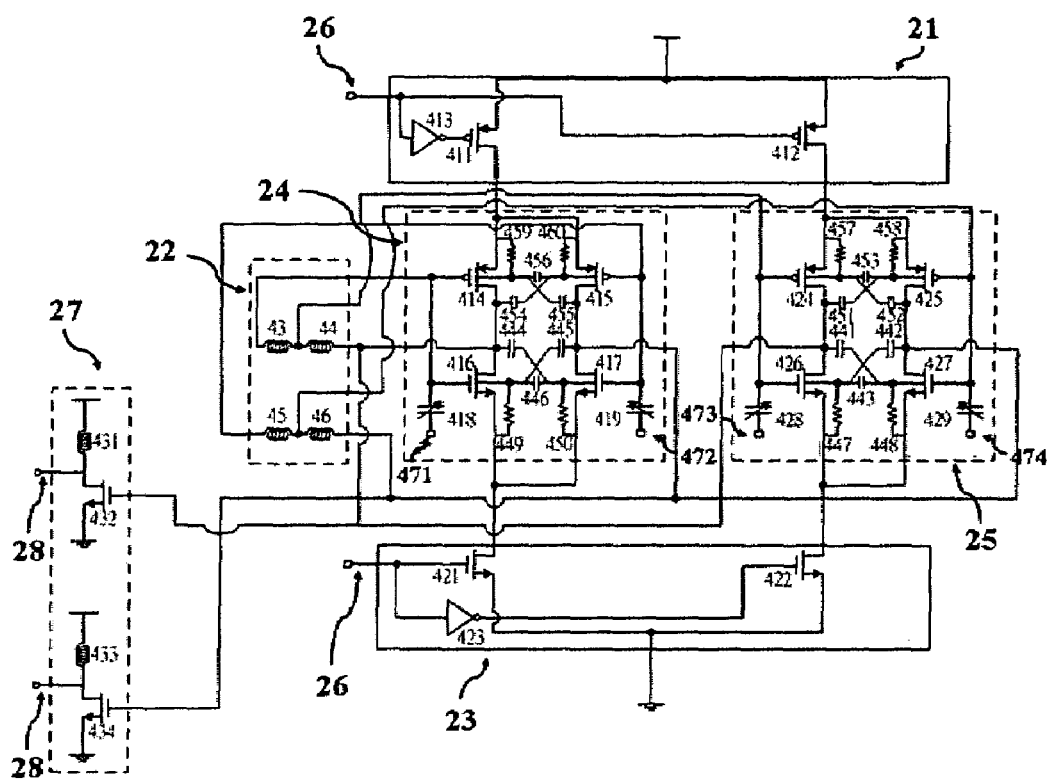
FIG. 6 shows the circuit of the dual-band VCO according to the third embodiment of the present invention; and Table I shows the frequency parameters of the dual-band VCO of the first embodiment of the present invention.

Referring to FIG. 6, it shows the circuit of the dual-band VCO according to the third embodiment of the present invention. The disclosed VCO use the type of dual back gate coupled difference.

The first resonant circuit 24 is constructed from PMOSFET (414)(415), NMOSFET (416)(417), variable capacitors (418) (419). Through the capacitors (444)(445)(446) and (454)(455)(456), the back gate of the NMOSFET and PMOSFET can be coupled to achieve the difference output. The voltage divider constructed from the capacitors (444)(445) (446) and (454)(455)(456) can reduce the phase noise of the dual band VCO 20 and the resistors (449)(450)(459)(460) can provide the DC bias to back gate of the transistor. The second resonant circuit 25 is constructed from PMOSFET (424)(425), NMOSFET (426)(427), variable capacitors (428) (429). Through the capacitors (441)(442)(443) and (451)(452)(453), the back gate of the NMOSFET and PMOSFET can be coupled to achieve the difference output. The voltage divider constructed from the capacitors (441)(442) (443) and (451)(452)(453) can reduce the phase noise of the dual band VCO 20 and the resistors (447)(448)(457)(458) can provide the DC bias to back gate of the transistor.

As voltage level of the bias of switching frequency 26 of the dual band VCO 20 is high, the transistor 411 of current source constructed from a PMOS FET 21 and the transistor 421 of the current source constructed from a NMOS FET 23 will be turned on. Thus, the first plurality of metal-oxide-semiconductor field effect transistor (MOSFET) of the first resonant circuit 24 can generate enough negative resistance ($-1/G_m$) to compensate the parasitic dissipated resistance Rp of resonant tank and then to achieve the starting condition of resonance. The inductors (43)(44) in series and the inductors (45)(46) in series of the inductor module 22 and the variable capacitor 418 of the first resonant circuit 24 determine the output signal of 2.4 GHz. Similarly, as voltage level of the bias of switching frequency 26 of the dual band VCO 20 is low, the dual band VCO will output a signal of 5.2 GHz.

The dual-band voltage controlled oscillator (VCO) according to the invention uses the current source in such two VCOs with different resonant frequencies as the switch device to combine the two VCOs and uses the common inductor module for the two VCOs to save the chip size.

From the above description, the dual-band power amplifier according to the present invention can obtain high gain and power output simultaneously at different frequencies. Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A dual-band voltage controlled oscillator, comprising:
   a plurality of resonant circuits, used to determine a output frequency of the dual band VCO;
   an inductor module, electrically connected to the plurality of resonant circuits, used to control the inductance of the plurality of resonant circuits, to tune the frequency range of the output frequency of the dual band VCO;
   a plurality of switches of current source, electrically connected to the plurality of resonant circuits, used to switch the output frequency of the dual band VCO;
   a buffer circuit, electrically connected to the inductor module and plurality of resonant circuits, used to isolate the interference of next stage circuit; and
   a output port, electrically connected to the buffer circuit, used to output the output signal.

2. A dual-band voltage controlled oscillator as claimed in claim 1, wherein the inductor module comprises:
   a plurality of inductor, combined with types of series or shunt, used to provide the required inductance of the plurality of resonant circuits, to tune the frequency range of the output frequency of the dual band VCO.

3. A dual-band voltage controlled oscillator as claimed in claim 1, wherein the plurality of resonant circuits comprises:
   a first resonant circuit, having a first plurality of metal-oxide-semiconductor field effect transistor (MOSFET), a first variable capacitor and a first tunable bias, used to tune a first output frequency of the dual band VCO; and
   a second resonant circuit, electrically connected to the first resonant circuit, having a second plurality of metal-oxide-semiconductor field effect transistor (MOSFET), a second variable capacitor and a second tunable bias, used to tune a second output frequency of the dual band VCO.

4. A dual-band voltage controlled oscillator as claimed in claim 1, wherein the plurality of switches of current source comprises:
   a current source constructed from a PMOS FET, electrically connected to the first resonant circuit and the second resonant circuit, having a third plurality of metal-oxide-semiconductor field effect transistor (MOSFET), a first inverter and a bias of switching frequency; and
   a current source constructed from a NMOS FET, electrically connected to the first resonant circuit and the second resonant circuit, having a fourth plurality of metal-oxide-semiconductor field effect transistor (MOSFET), a second inverter and the bias of switching frequency;
   where the first bias of switching frequency and the second bias of switching frequency output a signal of 0 or 1.

5. A dual-band voltage controlled oscillator as claimed in claim 4, wherein the bias of switching frequency selects the starting condition of resonance by using the signal of 0 or 1.

6. A dual-band voltage controlled oscillator as claimed in claim 1, wherein the plurality of resonant circuits are selected from one of the circuit groups, including a type of back gate coupled difference and a type of dual back gate coupled difference.

7. A dual-band voltage controlled oscillator as claimed in claim 1, wherein the inductor module is constructed in series from two spiral inductors fabricated by 0.18 μm technology.

* * * * *